(12) United States Patent
Acker

(10) Patent No.: US 11,169,006 B2
(45) Date of Patent: *Nov. 9, 2021

(54) SENSOR

(71) Applicant: Continental Teves AG & Co. oHG, Frankfurt (DE)

(72) Inventor: Heinrich Acker, Schwalbach (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 45 days.

This patent is subject to a terminal disclaimer.

(21) Appl. No.: 16/063,910

(22) PCT Filed: Feb. 14, 2017

(86) PCT No.: PCT/EP2017/053295
§ 371 (c)(1),
(2) Date: Jun. 19, 2018

(87) PCT Pub. No.: WO2017/140678
PCT Pub. Date: Aug. 24, 2017

(65) Prior Publication Data
US 2018/0372512 A1 Dec. 27, 2018

(30) Foreign Application Priority Data
Feb. 17, 2016 (DE) ............ 10 2016 202 403.5

(51) Int. Cl.
*G01D 5/20* (2006.01)
*G01D 5/22* (2006.01)
(Continued)

(52) U.S. Cl.
CPC .......... *G01D 5/2046* (2013.01); *G01B 7/003* (2013.01); *G01D 5/2216* (2013.01);
(Continued)

(58) Field of Classification Search
CPC .. G01D 5/00; G01D 5/12; G01D 5/14; G01D 5/20; G01D 5/204; G01D 5/2046;
(Continued)

(56) References Cited

U.S. PATENT DOCUMENTS 3,456,132 A    7/1969  Dechelotte
4,969,363 A   11/1990  Mochizuki
(Continued)

FOREIGN PATENT DOCUMENTS

CN    1928581 A    3/2007
CN   101501454 A   8/2009
(Continued)

OTHER PUBLICATIONS

German Search Report for German Application No. 10 2016 202 403.5, with partial translation, dated Jan. 10, 2017, 12 pages.
(Continued)

*Primary Examiner* — Hoai-An D. Nguyen
(74) *Attorney, Agent, or Firm* — RatnerPrestia

(57) ABSTRACT

A sensor including a circuit carrier, a number of measuring inductors on the circuit carrier, and a reference inductor that is coupled to the measuring inductors.

19 Claims, 2 Drawing Sheets

(51) Int. Cl.
*G01D 5/243* (2006.01)
*G01B 7/00* (2006.01)
*G01R 27/26* (2006.01)

(52) U.S. Cl.
CPC ............ *G01D 5/2258* (2013.01); *G01D 5/243* (2013.01); *G01R 27/2611* (2013.01)

(58) Field of Classification Search
CPC ...... G01D 5/22; G01D 5/2208; G01D 5/2216; G01D 5/225; G01D 5/2258; G01D 5/243; G01B 7/00; G01B 7/003; G01R 27/00; G01R 27/02; G01R 27/26; G01R 27/2611
USPC .... 324/200, 207.11, 207.13, 207.15, 207.25, 324/600, 649, 654, 76.11, 76.39, 76.75
See application file for complete search history.

(56) References Cited

U.S. PATENT DOCUMENTS

| | | | |
|---|---|---|---|
| 5,027,066 A | 6/1991 | Reder | |
| 5,539,358 A * | 7/1996 | Hedberg | H03B 5/326 331/107 A |
| 5,703,576 A | 12/1997 | Spillman et al. | |
| 5,712,563 A | 1/1998 | Kawagoe et al. | |
| 5,936,399 A | 8/1999 | Andermo et al. | |
| 5,952,822 A | 9/1999 | Kayserman et al. | |
| 6,166,535 A | 12/2000 | Irle et al. | |
| 6,236,199 B1 | 5/2001 | Irle et al. | |
| 6,316,931 B1 | 11/2001 | Nakagawa et al. | |
| 6,828,780 B2 * | 12/2004 | Jagiella | G01D 5/2033 324/207.15 |
| 7,719,264 B2 | 5/2010 | Tiemann | |
| 8,339,126 B2 | 12/2012 | Izak et al. | |
| 8,421,446 B2 | 4/2013 | Straubinger et al. | |
| 8,730,011 B2 * | 5/2014 | Altmann | A61B 34/20 340/8.1 |
| 9,188,421 B2 | 11/2015 | Prussmeier et al. | |
| 9,671,477 B2 | 6/2017 | Vaysse et al. | |
| 9,752,899 B2 | 9/2017 | Goto et al. | |
| 9,897,468 B2 | 2/2018 | Niwa et al. | |
| 10,746,720 B2 * | 8/2020 | Jennings | G01N 33/246 |
| 10,861,329 B2 * | 12/2020 | Dubois | G01V 3/105 |
| 10,866,120 B2 * | 12/2020 | Acker | G01D 3/08 |
| 2002/0017902 A1 | 2/2002 | Vasiloiu | |
| 2003/0107377 A1 | 6/2003 | Uzman | |
| 2004/0200260 A1 | 10/2004 | Klosterman et al. | |
| 2005/0151614 A1 * | 7/2005 | Dadafshar | H01F 27/255 336/223 |
| 2006/0104558 A1 | 5/2006 | Gallion et al. | |
| 2009/0243596 A1 * | 10/2009 | Izak | G01D 5/2053 324/207.16 |
| 2010/0006992 A1 | 1/2010 | Dirks | |
| 2010/0156402 A1 * | 6/2010 | Straubinger | G01D 5/202 324/207.25 |
| 2012/0242380 A1 | 9/2012 | Edwards | |
| 2013/0187643 A1 | 7/2013 | Lysen et al. | |
| 2013/0207626 A1 | 8/2013 | Chiba | |
| 2014/0043017 A1 * | 2/2014 | Patterson, III | G01B 7/004 324/202 |
| 2014/0125357 A1 | 5/2014 | Blondin et al. | |
| 2014/0203753 A1 | 7/2014 | Weinl et al. | |
| 2015/0048893 A1 | 2/2015 | Heid et al. | |
| 2015/0282308 A1 | 10/2015 | Meyer et al. | |
| 2015/0362340 A1 | 12/2015 | Montagne | |
| 2015/0369631 A1 | 12/2015 | Cheung et al. | |
| 2016/0006441 A1 | 1/2016 | van der Wagt et al. | |
| 2016/0209240 A1 | 7/2016 | Pfaffinger et al. | |
| 2016/0363463 A1 | 12/2016 | Niwa et al. | |
| 2017/0006667 A1 * | 1/2017 | Falcon | G01R 15/181 |
| 2017/0276517 A1 * | 9/2017 | Acker | G01D 5/2013 |
| 2018/0076834 A1 * | 3/2018 | Wloczysiak | H04B 1/48 |
| 2018/0188076 A1 | 7/2018 | Acker | |
| 2018/0193925 A1 | 7/2018 | Ketelaer | |
| 2018/0195881 A1 * | 7/2018 | Acker | G01D 5/243 |
| 2018/0287603 A1 | 10/2018 | Subramanian et al. | |
| 2018/0372512 A1 | 12/2018 | Acker | |
| 2019/0025087 A1 * | 1/2019 | Acker | G01D 5/225 |

FOREIGN PATENT DOCUMENTS

| | | |
|---|---|---|
| CN | 101545754 A | 9/2009 |
| CN | 101963514 A | 2/2011 |
| CN | 102003973 A | 4/2011 |
| CN | 103562683 A | 2/2014 |
| CN | 103837901 A | 6/2014 |
| CN | 203706814 U | 7/2014 |
| CN | 103278181 B | 3/2016 |
| DE | 3903278 C2 | 8/1990 |
| DE | 4006885 A1 | 10/1990 |
| DE | 4330140 A1 | 3/1995 |
| DE | 4311973 A1 | 2/1997 |
| DE | 19725806 A1 | 1/1999 |
| DE | 19738834 A1 | 3/1999 |
| DE | 19738836 A1 | 3/1999 |
| DE | 19745236 A1 | 5/1999 |
| DE | 19812965 A1 | 10/1999 |
| DE | 10128010 A1 | 1/2003 |
| DE | 69816218 T2 | 2/2004 |
| DE | 102005007731 A1 | 8/2006 |
| DE | 60029113 T2 | 12/2006 |
| DE | 102006026543 A1 | 12/2007 |
| DE | 102006046531 A1 | 4/2008 |
| DE | 102008015837 A1 | 10/2009 |
| DE | 102009027997 A1 | 1/2011 |
| DE | 102013204494 A1 | 10/2014 |
| DE | 112015000542 T5 | 10/2016 |
| EP | 0337939 A2 | 10/1989 |
| EP | 0629842 B1 | 3/1999 |
| EP | 1306649 A1 | 5/2003 |
| EP | 1744184 A2 | 1/2007 |
| EP | 1391735 B1 | 10/2012 |
| GB | 2340242 A | 2/2000 |
| WO | 2014200105 A1 | 12/2014 |
| WO | 2015129229 A1 | 9/2015 |

OTHER PUBLICATIONS

International Search Report and Written Opinion for International Application No. PCT/EP2017/053295, dated Jun. 19, 2017, 9 pages.
Chinese Office Action for Chinese Application No. 201780008032.8, dated Feb. 6, 2020, with translation, 19 pages.
Chinese Office Action for Chinese Application No. 201680042609.2, dated Aug. 2, 2019, with translation, 20 pages.
European Decison to Grant a Patent for European Application No. 16753607.7, dated Oct. 23, 2019, 45 pages.
Notice of Allowance for U.S. Appl. No. 15/740,562, dated Oct. 23, 2019, 13 pages.
German Search Report for German Application No. 10 2015 215 331.2, dated Nov. 28, 2016 with Partial Translation, 13 pages.
International Search Report and Written Opinion for International Application No. PCT/EP2016/068158, dated Nov. 18, 2016, 8 pages.
German Search Report for German Application No. 10 2016 202 402.7, dated Oct. 18, 2016, with partial translation, 9 pages.
International Search Report and Written Opinion for International Application No. PCT/EP2017/053292, dated Jun. 19, 2017, 9 pages.
Notice of Allowance for U.S. Appl. No. 15/741,593, dated Nov. 26, 2019, 15 pages.
Non Final Office Action for U.S. Appl. No. 15/741,593, dated Jan. 2, 2019, 31 pages.
Final Office Action for U.S. Appl. No. 15/741,593, dated Jun. 14, 2019, 23 pages.
Non Final Office Action for U.S. Appl. No. 16/071,766, dated Nov. 6, 2019, 15 pages.
Final Office Action for U.S. Appl. No. 16/071,766, dated Apr. 29, 2020, 23 pages.
Notice of Allowance for U.S. Appl. No. 16/071,766, dated Oct. 2, 2020, 22 pages.

(56) References Cited

OTHER PUBLICATIONS

Chinese Office Action for Chinese Application No. 201780008032.8, dated Dec. 29, 2020, 9 pages.

\* cited by examiner

SENSOR

CROSS REFERENCE TO RELATED APPLICATIONS

This application is the U.S. National Phase Application of PCT International Application No. PCT/EP2017/053295, filed Feb. 14, 2017, which claims the priority to German Patent Application No. 10 2016 202 403.5, filed Feb. 17, 2016, the contents of such applications being incorporated by reference herein.

FIELD OF THE INVENTION

The invention relates to a sensor, which can be used, for example, to detect measurement variables. In particular, such a sensor can be used in automobiles for detecting the position of a pedal or of a controller.

BACKGROUND OF THE INVENTION

Known sensors are often of complex design and difficult to evaluate.

SUMMARY OF THE INVENTION

Therefore an aspect of the invention aims to provide a sensor, which is embodied in an alternative manner, for example in a structurally simpler manner or in a manner that is simpler to wire.

An aspect of the invention relates to a sensor. Said sensor has a circuit carrier. Said sensor also has a number of measurement inductances, which are applied to the circuit carrier. Said sensor also has a reference inductance, which is coupled to the measurement inductances. In this case, said coupling may be, in particular, a magnetic, an electrical or a combined electrical and magnetic coupling.

A particularly simple production and a simple design can be achieved by means of the arrangement of the measurement inductances on the circuit carrier. In particular, the reference inductance can generate a magnetic field, which is detected by the measurement inductances, and which depends on an external variable and/or on the position or the location of a measurement body. This will be discussed in more detail further below.

The measurement inductances are advantageously electrically insulated from the reference inductance. For example, they can be separated by an air gap. However, they can also be separated, for example, by suitable electrically insulating materials. This prevents shorts and malfunctions.

The sensor can be configured, in particular, as a linear position sensor. It can also be configured as a force sensor. Such applications have been found to be advantageous in practice.

The measurement inductances can be applied to the circuit carrier, in particular, along a path. In particular, said path can be a straight path, a linear path or else an arc or circular arc. Such arrangements are advantageous, in particular, when a variable is intended to be measured along such a path, wherein, for example, a measurement body can be displaced along such a path.

According to one preferred embodiment, the sensor also has a measurement body, which can be moved relative to the circuit carrier. Such a measurement body can be coupled, for example, to external devices in order to record a variable to be measured, wherein the measurement body is typically displaced in accordance with said variable. Said measurement body can also change its location or position relative to the circuit carrier.

The measurement body may advantageously be able to be moved in parallel, in particular exclusively in parallel, with the path of the measurement inductances. This allows, for example, advantageous and precise measurement of a one-dimensional or two-dimensional variable. However, the measurement body may, for example, also be able to be moved transversely to the circuit carrier.

The circuit carrier may be, in particular, a printed circuit board. A circuit carrier of this kind typically has a planar surface, relative to which terms like "parallel" or "transverse" can be easily identified.

The measurement body is preferably ferromagnetic and/or electrically conductive. Said measurement body can thus be, for example, ferromagnetic, for example in the form of a permanent magnet. Said measurement body can also be electrically conductive and non-ferromagnetic. Said measurement body can also be ferromagnetic and electrically conductive. For example, it may be also a ferrite that is involved here, which is magnetically soft, that is to say highly permeable, non-conductive, but is also not a permanent magnet. Such embodiments have proven successful for influencing the coupling between the reference inductance and measurement inductances.

The measurement body can be separated from the measurement inductances and/or from the reference inductance by a respective air gap. This makes electrical insulation and advantageous free movability of the measurement body possible.

According to one embodiment, the measurement inductances are located within the reference inductance. In particular, this allows particularly good magnetic coupling.

According to one embodiment, the reference inductance surrounds the circuit carrier. This allows advantageous coupling to measurement inductances, which are located on the circuit carrier.

The reference inductance preferably generates a magnetic field when current flows through, said magnetic field penetrating the measurement inductances and preferably being changed by the measurement body depending on the position of the measurement body. This allows an advantageous measurement method for measuring a measurement variable. In this case, the position of the measurement body is typically connected to the measurement variable so that, when the measurement variable changes, the position of the measurement body also changes.

However, in principle, a location of the measurement body can also be detected, for example.

The measurement inductances are preferably applied to the circuit carrier using SMD technology. This allows a simple, advantageous and compact design.

According to one embodiment, at least some of the measurement inductances are electrically interconnected in series and/or in parallel. Through such interconnection, specific properties can be achieved, as a result of which the circuit can be adapted to specific applications, for example. In particular, through parallel or series interconnection, specific measurement inductances can be evaluated together in a suitable manner. In this case, any of the measurement inductances can be interconnected in series and/or in parallel.

According to one development, the sensor also has a capacitance, which is interconnected with the reference inductance to form a parallel resonant circuit. According to this development, the sensor also has an electronic control unit. Said electronic control unit is connected directly to the parallel resonant circuit, wherein this can contain both a direct connection by means of electrical lines or conductor tracks and a connection by means of a resistor, for example.

The electronic control unit is configured to excite the parallel resonant circuit into oscillation at an excitation frequency that is derived from a clock of the electronic control unit.

Moreover, the electronic control unit is connected directly to each of the measurement inductances and is configured to measure a value, which indicates a measurement variable, at the respective measurement inductance.

The embodiment just described makes it possible to advantageously use particularly suitable wiring with electronic control unit, wherein such wiring makes, in particular, easy evaluation and particularly good scalability possible. In particular, only a very low additional outlay is required for use of a multiplicity of measurement inductances.

In the case of indicating a measurement variable, it is also possible, in particular, to talk about a value being influenced by the measurement variable. In this case, for example, said measurement variable may be an external measurement variable such as the position of a pedal in an automobile or the position of a controller.

According to one development, the electronic control unit is configured to determine measurement inductances, which are influenced by a measurement body, and subsequently to determine a position of the measurement body based on measurements at said measurement inductances.

It is understood that the term measurement inductance relates here to a component, which can typically also be referred to as an inductor. This is noted, in particular, with respect to a possible risk of confusion with the term of inductance as electrical property of such an inductor.

Through the procedure just described and a corresponding configuration of the electronic control unit, for example, one, two or three measurement inductances can be identified from a plurality of measurement inductances, which are influenced by the measurement body at a specific time. Subsequently, corresponding values indicative of the position of the measurement body can be measured at said measurement inductances. At other measurement inductances, which are not currently being influenced by the measurement body, for example, no measurement or no further processing can then be carried out at this time. This can reduce outlay and/or necessary computation power.

An embodiment just described makes it possible, in particular, to advantageously use a measurement principle that can be scaled in virtually any desired manner without considerable outlay. This means, in particular, that a multiplicity of measurement inductances can be used and hence a very high resolution and/or a particularly long measurement range can be achieved, without complicated wiring being required. Essentially just one input of the electronic control unit and one corresponding electrical connection is required for each measurement inductance used. The excitation frequency can be different from a resonant frequency of the parallel resonant circuit preferably by no more than 25%, preferably no more than 20%, particularly preferably no more than 15%, even more preferably no more than 10%. This has been found to be advantageous in practice.

The excitation frequency may, in particular, be able to be set, wherein it can be controlled, in particular, by an element with a variable frequency.

A lock-in amplifier can advantageously be used for measuring.

The first inductance, the measurement inductance and/or the capacitance can be, for example, components having a respective tolerance of between 1% and 10%, preferably of 1%, or of less than 1%. Such tolerances have been found to be advantageous.

The measurement inductance can be coupled, for example, galvanically or magnetically to the reference inductance.

According to one development, the parallel resonant circuit can have a maximum Q factor obtained through maximization of a value of $Vt*Vt/V0$. Here, Vt denotes a ratio of coil current and supply line current given maximum deviation of the capacitance and of the reference inductance from their respective values at the resonant frequency of the parallel resonant circuit. V0 denotes a ratio of coil current and supply line current for respective values of capacitance and reference inductance at the resonant frequency of the parallel resonant circuit. Such a procedure has proven to be particularly advantageous for typical applications.

The maximum Q factor can be limited particularly by interconnection of a resistor in the parallel resonant circuit.

The electronic control device can be configured, in particular, to measure one or more of the following characteristic values using the measurement inductances:
  self-inductance or inductance,
  resistance loss,
  complex impedance,
  angle loss,
  mutual inductance in relation to the first inductance.

The sensor can advantageously have two, three or more than three measurement inductances. For example, it can also have four, five or more than five measurement inductances. In particular, in the circuit just mentioned, the number of measurement inductances can be scaled in a particularly simple manner.

According to another development, the sensor has a plurality of measurement inductances, wherein each measurement inductance has a magnet core associated therewith. The measurement inductances are in this case arranged along a path. Furthermore, the measurement inductances are electrically connected in series. The measurement inductances have respective inductances, which increase along the path in one direction. The feature referred to here as inductance is the inductance as an electrical property of an inductor.

This makes it possible to jointly evaluate all the measurement inductances using the different values of the respective inductance. This also makes it possible to simply scale to a multiplicity of inductances.

According to one embodiment, the measurement inductances are in this case connected in series along the path. This makes simple evaluation possible. However, it is understood that other interconnections that are not oriented on the path are also possible.

In particular, in such an embodiment, the measurement body may be able to be moved along the path, as a result of which advantageous measurement of the position of said measurement body is possible.

In this case, the sensor is preferably configured to generate a common output signal, in particular a total inductance, depending on the position of the measurement body along the path.

The measurement body can be, for example, a ferromagnetic, highly permeable body, an electrically conductive body or else a permanent magnet. It can also be made, for example, of steel, which is magnetically soft, that is to say highly permeable, and conductive.

The respective magnet cores preferably do not have remanent magnetization.

The circuit carrier may be, in particular, a printed circuit board, a leadframe or a molded-interconnected-device (MID) carrier.

The measurement inductances are preferably spaced apart so close to one another that, when the measurement body moves along the path, a characteristic curve of the total inductance is produced, said characteristic curve increasing or falling monotonously at least over half of the path, preferably over at least three quarters of the path or else over the entire path. This allows advantageous evaluation and prevents ambiguities.

The sensor can have, for example, a guide, which guides the measurement body. Such a guide can guide the measurement body, in particular, along the mentioned path.

The sensor can have an actuating element by means of which the measurement body can be moved from outside, for example along the path.

Numerous measurement circuits known from the prior art have the problem that multichannel, simultaneous measurement is expensive because, for each channel, operation has to take place at a high level of circuit complexity. It can therefore be advantageous, for example, to combine the general approach of conventionally populating very cheap SMD inductances on a circuit carrier in bulk and using an arrangement of a group of such inductances as an inductive system with a series or parallel circuit of the inductances. This forms a total inductance, which can be measured using a measurement channel in a cost-effective manner.

In the further development of a measurement circuit described further above, the advantage over the prior art is, in particular, that the channel-related costs are extremely low because an extension of an existing circuit by additional measurement channels does not require additional components. Through an interconnection, a reduction in information can be achieved, for example. Two complex parameters can be obtained from two individual inductances; typically only one can be obtained from the series or parallel circuit thereof.

Inductances that react in a complementary manner to a measurement variable are typically not combined. While the individual elements deliver metrological information, a series circuit typically produces a constant inductance; the parallel circuit produces an only slight dependence on the measurement variable.

For many measurement objects, it is advantageous to use a multiplicity of inductances, in particular measurement inductances, in order to assign a region that is to be covered by the inductive system. Population of this kind on a circuit carrier is cost-effective. The immediate vicinity of the inductances is advantageously used for sensor-based functions. In particular, by way of the wiring described above, it is possible to efficiently dispense with series or parallel circuits, wherein a metrologically efficient system is still obtained.

In this case, it is not strictly necessary to dispense with series or parallel circuits entirely. For example, it is possible to advantageously use series or parallel circuits of inductances, which react to the measurement variable in the same way, because then typical disadvantages do not arise. An arrangement of individual inductances, which achieves the measurement object, is thus typically determined. Subsequently, using the criteria for information reduction, parameter modification as a function of the measurement variable and influence on the signal-to-noise ratio, it is possible to check which inductances can be combined without detriment. All groups to which this does not apply remain uncombined.

For each measurement channel, a measurement circuit typically requires a portion of the measurement time available for each measurement cycle. In many sensor-based applications, for example the control of chassis components such as the brake and steering wheel in the automobile, the measurement cycle is so short that only a limited number, often only just a sufficient number, of individual measurements can be carried out in this cycle. An excessive reduction in the measurement for a measurement channel in this case likewise results in a reduction in the signal-to-noise ratio. All combinations, that is to say series or parallel circuits, in which the known disadvantages and/or disadvantages illustrated above do not arise or arise only to a very insignificant extent should therefore preferably be implemented.

In many applications, there is no space for inductances having particularly great characteristic values, which is due, in particular, to a desired miniaturization of sensors. The resulting lack of a total inductance of the inductive system that can be perceived, which often arises from a metrological point of view, typically leads, when combining inductances, to the series circuit in many cases being preferred over the parallel circuit since the total inductance is then greater than the individual inductances.

BRIEF DESCRIPTION OF THE DRAWINGS

Further features and advantages will be gathered by a person skilled in the art from the exemplary embodiment described below with reference to the appended drawing, in which.

DETAILED DESCRIPTION OF THE PREFERRED EMBODIMENTS

Figure 1:
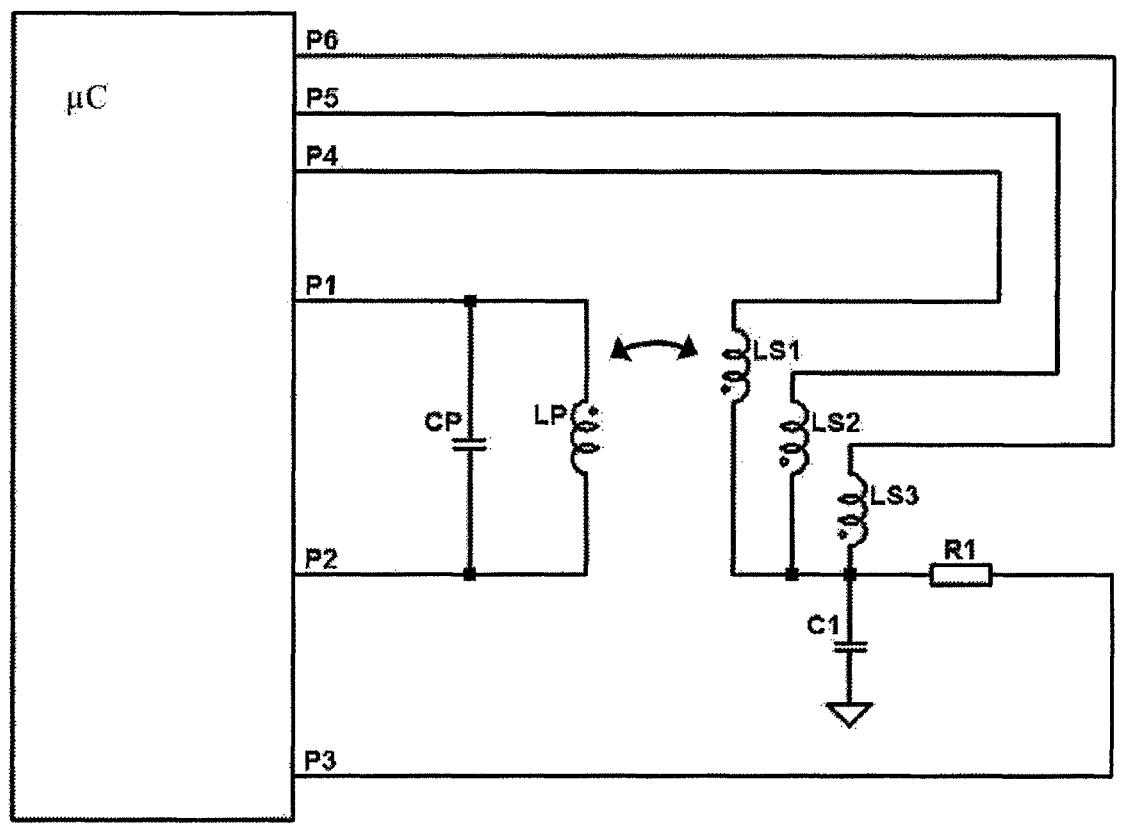
FIG. 1: shows a measurement circuit.

FIG. 1 shows an exemplary embodiment of a measurement circuit, which can advantageously be used with the sensor according to an aspect of the invention. In this case, an electronic control unit is provided in the form of a controller μC. Said microcontroller has a total of six ports, which are denoted by P1, P2, P3, P4, P5 and P6.

A parallel resonant circuit is connected at the ports P1 and P2, which parallel resonant circuit consists in the present case of a reference inductance LP and a capacitor CP connected in parallel therewith.

A resistor R1 is connected at the port P3, a smoothing capacitor C1 being connected in turn to said resistor. The smoothing capacitor C1 is connected to ground on the opposite side.

In this way, a defined voltage can be set at the pole of the resistor R1 opposite the port P3 and, specifically, in particular, by suitable pulse-width modulation at the port P3. Connected to said pole are three measurement inductances LS1, LS2, LS3, which are electrically connected directly to the ports P4, P5 and P6. The measurement inductances LS1, LS2, LS3 are magnetically coupled to the reference inductance LP. When this coupling is influenced by a measurement body (not illustrated), the position and/or location of the measurement body can be identified by evaluating corresponding signals of the measurement inductances LS1, LS2, LS3.

Figure 2:
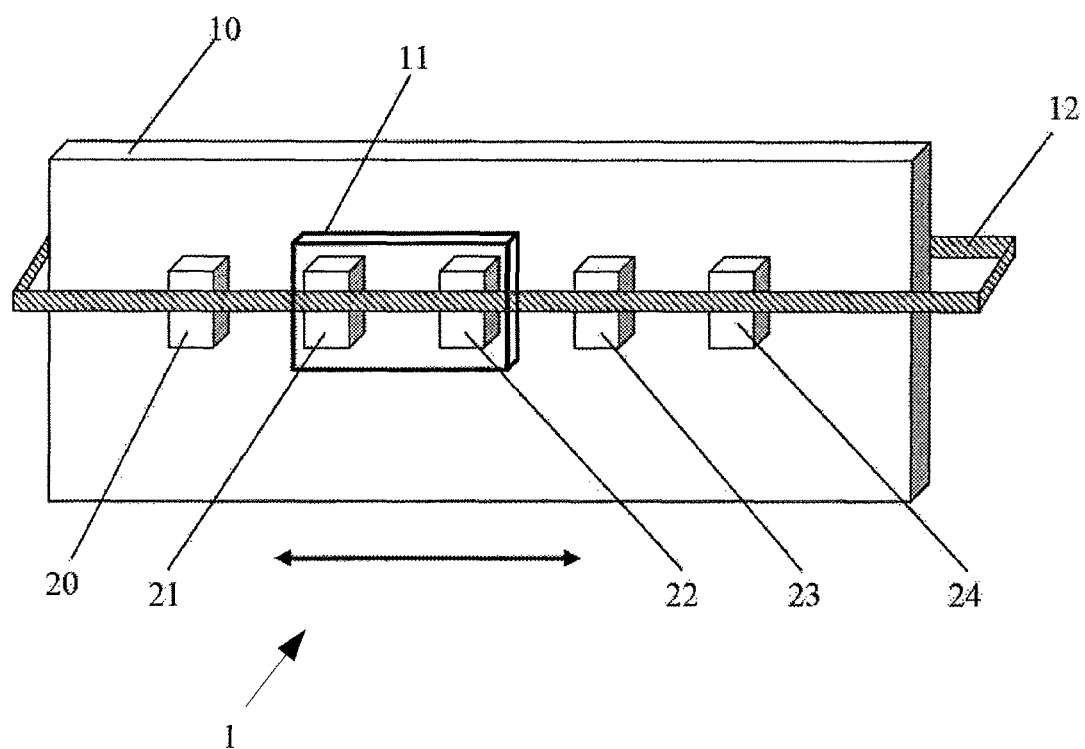
FIG. 2: shows a sensor.

FIG. 2 shows a sensor 1 according to one exemplary embodiment, of an aspect of the invention, which is embodied in the present case as a linear position sensor. The measurement circuit is not illustrated; reference is made to FIG. 1 in this respect.

In the sensor 1, a total of five measurement inductances 20, 21, 22, 23, 24 are applied to a circuit carrier 10 in a linear arrangement. SMD technology is used for this purpose.

The measurement inductances 20, 21, 22, 23, 24 are connected to a measurement circuit in the manner of FIG. 1 via conductive connections (not illustrated) on the circuit carrier 10.

A wire-wound reference inductance 12 is wound around the circuit carrier 10 at the height of the measurement inductances 20, 21, 22, 23, 24, which reference inductance is connected to the measurement circuit, but is not conductively connected directly to the other inductances, that is to say the measurement inductances 20, 21, 22, 23, 24. A ferromagnetic or conductive measurement body 11 is arranged close to and at the height of the inductances 20, 21, 22, 23, 24, which measurement body is separated from the entire arrangement of measurement inductances 20, 21, 22, 23, 24 by a respective air gap. This also ensures electrical insulation and also free movability of the measurement body 11.

The measurement body 11 is mounted such that it can move with the result that it can be displaced via the linear arrangement of the measurement inductances 20, 21, 22, 23, 24. This is shown in FIG. 2 by a double-headed arrow.

The functioning of the embodiment shown consists in the reference inductance 12 generating a magnetic field, which penetrates the measurement inductances 20, 21, 22, 23, 24 and induces a voltage in said measurement inductances. The measurement inductances 20, 21, 22, 23, 24 are, as inductances, part of the measurement circuit, which is to be expanded for this from three to five measurement channels. The measurement circuit determines the five induced voltages. Said induced voltages are not all equal because the magnetic field of the reference inductance 12 is changed locally by the measurement body 11.

The measurement of the induced voltage for each measurement inductance 20, 21, 22, 23, 24 allows the position of the measurement body 11 to be calculated by virtue of first the one to two measurement inductances 20, 21, 22, 23, 24 under its influence being determined and then a position value being calculated from the signals of said measurement inductances. Said position value can have a significantly higher spatial resolution than according to the grid dimension of the measurement inductances 20, 21, 22, 23, 24. In the state shown in FIG. 2, the measurement body 11 is located above the measurement inductances 21 and 22.

An advantage of the evaluation of the signals of the individual inductances compared to a series circuit consists, in particular, in that the calculated spatial resolution is independent of the number of inductances.

Reference is further made to the advantage that, when using the measurement circuit shown in FIG. 1 and/or the sensor shown in FIG. 2, particularly advantageous and simple scaling to a multiplicity of measurement inductances is possible, since ultimately only one respective additional measurement inductance, one additional port and one corresponding connection are required.

The claims that are part of the application do not represent any dispensing with the attainment of further protection.

If it turns out in the course of proceedings that a feature or a group of features is not absolutely necessary, then the applicant aspires right now to a wording for at least one independent claim that no longer has the feature or the group of features. This may be, by way of example, a subcombination of a claim present on the filing date or may be a subcombination of a claim present on the filing date that is limited by further features. Claims or combinations of features of this kind requiring rewording can be understood to be covered by the disclosure of this application as well.

It should further be pointed out that configurations, features and variants of aspects of the invention that are described in the various embodiments or exemplary embodiments and/or shown in the figures are combinable with one another in any way. Single or multiple features can be interchanged with one another in any way. Combinations of features arising therefrom can be understood to be covered by the disclosure of this application as well.

Back-references in dependent claims are not intended to be understood as dispensing with the attainment of independent substantive protection for the features of the back-referenced subclaims. These features can also be combined with other features in any way.

Features that are disclosed only in the description or features that are disclosed in the description or in a claim only in conjunction with other features may fundamentally be of independent significance essential to aspects of the invention. They can therefore also be individually included in claims for the purpose of distinction from the prior art.

The invention claimed is:

1. A sensor, comprising:
   a circuit carrier,
   a plurality of measurement inductances, which are applied to the circuit carrier using SMD technology, and
   a reference inductance, which is coupled to the measurement inductances,
   wherein the measurement inductances are located within the reference inductance.

2. The sensor as claimed in claim 1,
   wherein the measurement inductances are electrically insulated from the reference inductance.

3. The sensor as claimed in claim 1,
   which is configured as a linear position sensor.

4. The sensor as claimed in claim 1,
   wherein the measurement inductances are applied to the circuit carrier along a path.

5. The sensor as claimed in claim 1, further comprising a measurement body, which is configured to be moved relative to the circuit carrier.

6. The sensor as claimed in claim 4,
   wherein the measurement body is configured to be moved in parallel, with the path of the measurement inductances.

7. The sensor as claimed in claim 5,
   wherein the measurement body is ferromagnetic and/or electrically conductive.

8. The sensor as claimed in claim 5,
   wherein the measurement body is separated from the measurement inductances and/or from the reference inductance by a respective air gap.

9. The sensor as claimed in claim 6, wherein the measurement body is ferromagnetic and/or electrically conductive.

10. The sensor as claimed in claim 5,
    wherein the reference inductance generates a magnetic field when current flows through, said magnetic field penetrating the measurement inductances and being changed by the measurement body depending on the position of the measurement body.

11. The sensor as claimed in claim 6, wherein the measurement body is separated from the measurement inductances and/or from the reference inductance by a respective air gap.

12. The sensor as claimed in claim 1,
wherein at least some of the measurement inductances are electrically interconnected in series and/or in parallel.

13. The sensor as claimed in claim 1, further comprising:
a capacitance, which is interconnected with the reference inductance to form a parallel resonant circuit, and
an electronic control unit,
wherein the electronic control unit is connected directly to the parallel resonant circuit and is configured to excite the parallel resonant circuit into oscillation at an excitation frequency that is derived from a clock of the electronic control unit, and
wherein the electronic control unit is connected directly to each of the measurement inductances and is configured to measure a value, which indicates a measurement variable, at the respective measurement inductance.

14. The sensor as claimed in claim 13,
wherein the electronic control unit is configured:
to determine measurement inductances, which are influenced by a measurement body, and subsequently to determine a position of the measurement body based on measurements at said measurement inductances.

15. The sensor as claimed in claim 1,
wherein each measurement inductance has a magnet core associated therewith,
wherein the measurement inductances are arranged along a path,
wherein the measurement inductances are electrically connected in series, and
wherein the measurement inductances have respective inductances, which increase along the path in one direction.

16. The sensor as claimed in claim 2, which is configured as a linear position sensor.

17. The sensor as claimed in claim 1, wherein the measurement inductances are applied to the circuit carrier along a straight path, an arc or circular arc.

18. The sensor as claimed in claim 5, wherein the measurement body is configured to be moved in parallel with the path of the measurement inductances.

19. The sensor as claimed in claim 1,
wherein at least some of the measurement inductances are electrically interconnected in series.

\* \* \* \* \*